United States Patent [19]

Honma et al.

[11] Patent Number: 5,214,478
[45] Date of Patent: May 25, 1993

[54] IMAGE RECORDING APPARATUS PROVIDED WITH A SELECTIVE POWER APPLYING DEVICE

[75] Inventors: Yoshiyasu Honma; Yasuhiro Hattori, both of Nagoya; Shigeru Kagayama, Owariasahi, all of Japan

[73] Assignee: Brother Kogyo Kabushiki Kaisha, Nagoya, Japan

[21] Appl. No.: 780,239

[22] Filed: Oct. 22, 1991

[30] Foreign Application Priority Data

Oct. 25, 1990 [JP] Japan .................................. 2-289927
Feb. 22, 1991 [JP] Japan .................................. 3-028288
Mar. 27, 1991 [JP] Japan .................................. 3-063286

[51] Int. Cl.$^5$ ............................................ G03G 71/00
[52] U.S. Cl. ................................. 355/270; 355/27; 355/245; 355/210
[58] Field of Search ............... 355/245, 253, 259, 269, 355/270, 27, 210

[56] References Cited

U.S. PATENT DOCUMENTS

| | | | |
|---|---|---|---|
| 2,901,374 | 8/1959 | Gundlach | 355/245 X |
| 2,968,552 | 1/1961 | Gundlach | 355/245 X |
| 3,834,809 | 9/1974 | Yoshizawa et al. | 355/211 X |
| 3,924,945 | 12/1975 | Weigl | 355/258 |
| 4,399,209 | 8/1983 | Sanders et al. | 430/138 |
| 4,545,669 | 10/1985 | Hays et al. | 355/253 |
| 4,637,708 | 1/1987 | Yuasa | 355/245 X |
| 4,694,310 | 9/1987 | Saito et al. | 355/245 X |
| 4,723,138 | 2/1988 | Hashimoto et al. | 346/160 |
| 4,985,727 | 1/1991 | Sakai et al. | 355/27 |
| 5,038,710 | 8/1991 | Kagayama et al. | 118/653 |
| 5,059,506 | 10/1991 | Mori et al. | 430/138 |
| 5,086,318 | 2/1992 | Takeda et al. | 355/271 |

FOREIGN PATENT DOCUMENTS 63-36253 2/1988 Japan .
2-90838 12/1988 Japan .
2-16560 1/1990 Japan .
2-126233 5/1990 Japan .

*Primary Examiner*—Fred L. Braun
*Attorney, Agent, or Firm*—Oliff & Berridge

[57] ABSTRACT

The invention relates to a selective particle applying device provided with a developer applying device. The selective particle applying device applies a developer to the entire surface of a capsule sheet coated with microcapsules, disposes the capsule sheet with its surface coated with the developer facing a developer removing electrode provided with a photoconductive member to which a predetermined voltage is applied, splits a light beam by a light beam splitter, irradiates the developer removing electrode with one of the split light beams, and irradiates the capsule sheet with the other split light beam. Portions of the photoconductive member irradiated intensely with the split light beam become conductive to enhance the intensity of electric fields created between conductive portions of the developer removing electrode and the capsule sheet. Consequently, the developer coating portions of the capsule sheet, corresponding to the conductive portions of the developer removing electrode, are drawn to the developer removing electrode to leave the developer only in portions of the capsule sheet necessary for forming an image.

21 Claims, 8 Drawing Sheets

IMAGE RECORDING APPARATUS PROVIDED WITH A SELECTIVE POWER APPLYING DEVICE

BACKGROUND OF THE INVENTION

1. Field of the Invention

The invention relates to an image recording apparatus provided with a selective powder applying device for selectively applying powder, such as powder of a developer or microcapsules, to a recording medium.

2. Description of the Related Art

Image recording apparatuses have been known for copying an original picture on a photosensitive, pressure-sensitive recording medium formed by coating the surface of a backing with microcapsules. Among those known image recording apparatuses, an image recording apparatus, such as disclosed in U.S. Pat. No. 4,985,727, forms a chemical latent image of an original picture on the surface of a photosensitive, pressure-sensitive recording medium coated with microcapsules, and applies a developer selectively to the chemical latent image. This image recording apparatus employs photoconductive means to apply a powdery developer selectively to the surface of a photosensitive, pressure-sensitive recording medium coated with microcapsules. The microcapsules comprise a photosetting resin, which sets when exposed to light, and a color precursor which reacts with a developer to develop a color. Such microcapsules are disclosed in U.S. Pat. No. 4,399,209 and hence the description thereof will be omitted.

In the operation of this image recording apparatus, light emitted by a light source is reflected by the surface of a document. The reflected light carries image information because the same is reflected by the surface of the document in which an original picture is formed. The reflected light is projected on the image forming surface of a photosensitive, pressure-sensitive recording medium coated with the microcapsules to form a chemical latent image of the original picture on the image forming surface by selectively setting the microcapsules according to the image information. Concurrently, an image scanner scans the document to obtain image information and a laser light source emits a laser beam according to the image information. A photoconductive drum is exposed to the laser beam to form an electrostatic latent image of the original picture on the photoconductive drum. Then, a powdery developer is applied electrostatically to the electrostatic latent image formed on the photoconductive drum. Subsequently, the developer applied to the photoconductive drum is transferred to the image forming surface of the photosensitive, pressure-sensitive recording medium coated with the microcapsules and carrying the chemical latent image. Then, the photosensitive, pressure-sensitive recording medium and an ordinary recording sheet are joined closely for pressure-development. In the pressure-development, the microcapsules, which have not been exposed to light and have not set, collapse to shed the color precursor contained therein, the shed color precursor and the developer interact to develop a color. Since the pattern of the collapsed microcapsules corresponds to the original picture, a color image of the original picture is formed on the recording sheet. As is obvious from the foregoing, this image recording apparatus needs an image reading device, such as the scanner, to apply the granular developer selectively to the photoconductive drum.

SUMMARY OF THE INVENTION

To solve the foregoing problems, an object of the invention is to provide an image recording apparatus incorporating an inexpensive, compact selective powder applying device.

To achieve the object, the image recording apparatus incorporating a selective powder applying device in accordance with the invention for recording an image on a recording medium according to image information comprises: a photosensitive, pressure-sensitive recording medium; a powder applying means for applying charged powder to the entire surface of the photosensitive, pressure-sensitive recording medium; a powder removing electrode comprising at least a photoconductive member to which a voltage is applied disposed near the image forming surface of the photosensitive, pressure-sensitive recording medium coated with the powder but with a predetermined space therebetween; light splitting means for splitting a light beam carrying image information to irradiate the photosensitive, pressure-sensitive recording medium and the powder removing electrode individually with the split light beams; pressure-developing means for forming an image on the recording medium by superposing the photosensitive, pressure-sensitive recording medium, after it has passed the powder removing electrode and the recording medium, by compressing the superposed photosensitive, pressure-sensitive recording medium and the recording medium; and fixing means for fixing an image on the recording medium by heating the recording medium carrying the image.

According to the invention thus structured, the powder applying means applies the charged powder to the entire surface of the photosensitive, pressure-sensitive recording medium, and then, with the surface of the photosensitive, pressure-sensitive recording medium, coated with the powder, and the powder removing electrode, comprising the photoconductive member to which a predetermined voltage is applied, facing each other, the light splitting means splits the light beam carrying the image information into two light beams to irradiate the powder removing electrode from behind the same with one of the light beams and to irradiate the photosensitive, pressure-sensitive recording medium with the other light beam.

Portions of the photoconductive member irradiated intensely with the light beam become conductive, thereby enhancing the intensity of portions of an electric field created between the photoconductive member and the photosensitive, pressure-sensitive recording medium corresponding to the conductive portions of the photoconductive member and, consequently, the charged powder coating portions of the photosensitive, pressure-sensitive recording medium corresponding to the intensely irradiated portions of the photoconductive member fly toward the powder removing electrode. That is, the powder coating portions of the image forming surface of the photosensitive, pressure-sensitive recording medium corresponding to blank portions of the image information are removed. Thus, portions of the surface of the photosensitive, pressure-sensitive recording medium corresponding to the image portions of the image information are not coated with the powder while portions of the surface of the photosensitive, pressure-sensitive recording medium corresponding to image portions of the image information are coated with the powder. Thus, the invention is capable of applying the powder to only portions of the surface of the photosensitive, pressure-sensitive recording medium necessary for forming an image.

BRIEF DESCRIPTION OF THE DRAWINGS

Preferred embodiments of the invention will be described in detail with reference to the following figures, wherein.

DETAILED DESCRIPTION OF THE PREFERRED EMBODIMENTS

An image recording apparatus in a first embodiment according to the invention will be described hereinafter with reference to the accompanying drawings. In this embodiment, the powder is a powder developer which reacts with a color precursor contained in microcapsules to develop a color.

Figure 1:
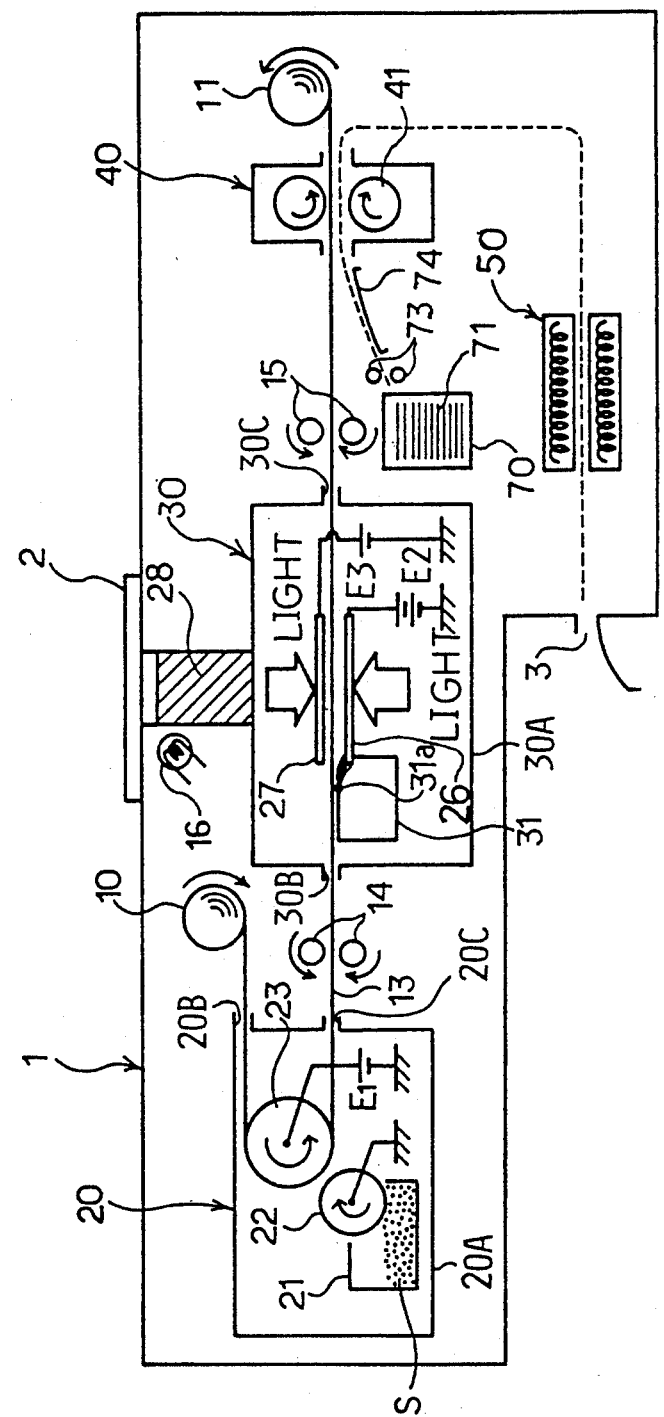
FIG. 1 is a schematic view of an image recording apparatus in a first embodiment according to the invention.
Figure 2:
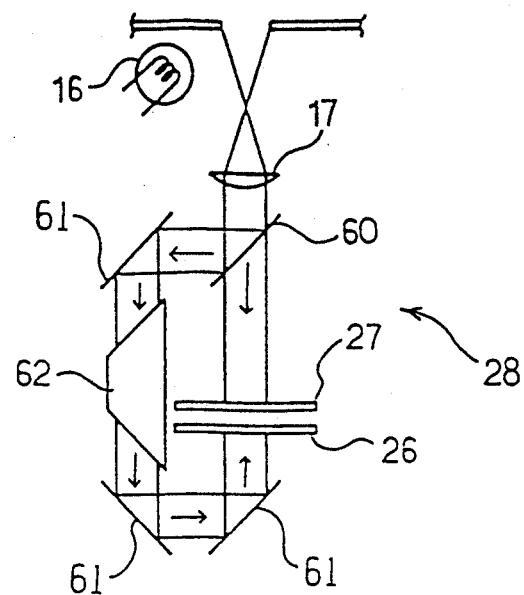
FIG. 2 is a diagrammatic view of a light splitting device included in the image recording apparatus of FIG. 1.
Figure 3:
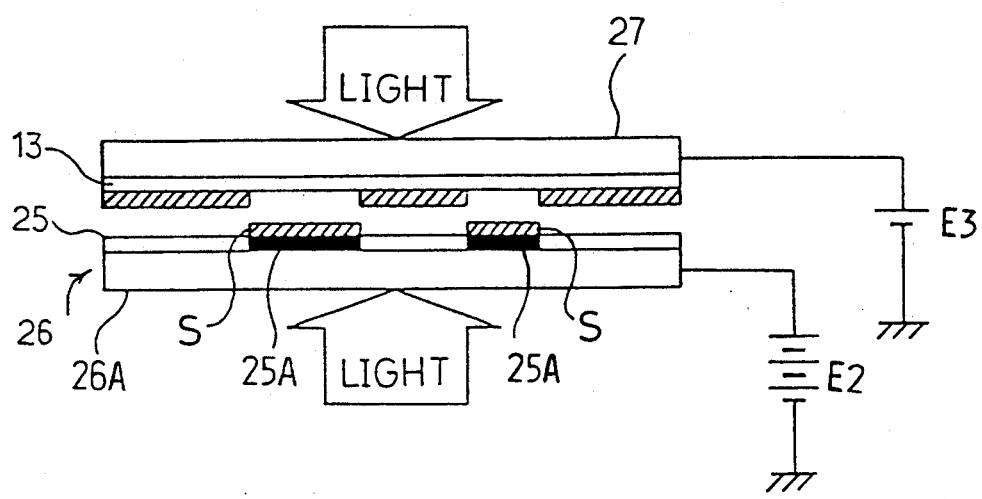
FIG. 3 is a schematic sectional view of a powder removing electrode unit included in the image recording apparatus of FIG. 1.

First, the general structure of the image recording apparatus provided with a selective developer applying device will be described with reference to FIGS. 1 to 3. FIG. 1 is a schematic view of the image recording apparatus in the first embodiment according to the invention provided with the selective developer applying device, FIG. 2 is a schematic view of a light beam splitter included in the image recording apparatus in the first embodiment, and FIG. 3 is a schematic view of a powder removing electrode unit included in the image recording apparatus in the first embodiment.

The image recording apparatus has a document support table 2 provided on the upper wall of a housing 1. The housing is provided in its lower portion with a delivery opening 3 through which a finished recording sheet is ejected. The image recording apparatus comprises, as principal components, a developer applying unit 20, a developer exposing/removing unit 30, a pressure-developing unit 40, and a fixing unit 50.

The document support table 2 comprises a transparent contact glass on which is placed a document (not shown), carrying a surface image, in contact with the contact glass.

The developer applying unit 20 applies a developer to the entire image recording surface of a photosensitive, pressure-sensitive recording medium 13 (hereinafter referred to as "capsule web" or "capsule sheet") coated with microcapsules. The capsule web 13 is formed by coating a transparent backing with numerous microcapsules. As mentioned above, the microcapsules used are disclosed in U.S. Pat. No. 4,399,209 and, hence, the description thereof will be omitted. The developer applying unit 20 comprises a toner box 21, a developer feed roller 22, a developer applying roller 23, and a casing 20A containing those components.

The casing 20A is provided in its one side wall with an inlet opening 20B and an outlet opening 20C. The capsule web 13 travels through the inlet opening 20B into the developer applying unit 20 and out of the same through the outlet opening 20C.

The toner box 21 contains a developer S therein and the developer feed roller 22 is disposed so that a portion thereof is received always in the toner box 21.

The developer feed roller 22 is formed of a metal, such as a steel or aluminum, and is grounded. The surface of the developer feed roller 22 is finished with a grooved surface or a matted surface to facilitate feeding the developer. The developer feed roller 22 is journaled on the toner box 21 so as to be rotated in the direction of the arrow by driving means (not shown). When the developer feed roller 22 is rotated to rub the developer S contained in the toner box 21, the developer S is electrified triboelectrically. In this embodiment, the developer S is charged negatively. The triboelectrically electrified developer S adheres to the surface of the developer feed roller 22 and is transported toward a position opposite to the developer applying roller 23 as the developer feed roller 22 rotates.

The developer applying roller 23 is disposed near the developer feed roller 22 with a predetermined space therebetween. The capsule web 13 is extended around the developer applying roller 23. The developer applying roller 23 is formed of a metal, such as a steel or aluminum, and is connected to the positive terminal of a dc power source E1. Accordingly, the negatively charged developer S transported by the developer feed roller 22 is attracted to the developer applying roller 23. The developer applying roller 23 is journaled and is rotated in the direction of the arrow by driving means (not shown). The capsule web 13 wound around the developer applying roller 23 is advanced and the developer S is applied electrostatically to the entire image forming surface of the capsule web 13 coated with the microcapsules as the developer applying roller rotates. After being thus coated with the developer S, the capsule web 13 travels out of the developer applying unit 20 through the outlet opening 20C.

The developer exposing/removing unit 30 irradiates the capsule web 13 with a light beam reflected by the document placed on the document support table 2 to form a chemical latent image of the original picture on the capsule web 13 and selectively removes the developer S applied to the capsule web 13 by the developer applying unit 20. The exposing/removing unit 30 comprises a developer removing electrode 26, a counter electrode 27, a recovery box 31, and a casing 30A containing those components. An exposure lamp 16 for illuminating the document, and a light beam splitter 28 for splitting the light beam reflected by the document are disposed above the exposing/removing unit 30.

An inlet opening 30B and an outlet opening 30C are formed respectively in the opposite side walls of the casing 30A. The capsule web 13 having the image forming surface entirely coated with the developer S by the developer applying unit 20 enters the casing 30A through the inlet opening 30B and goes out through the outlet opening 30C from the casing 30A after the capsule web 13 has been exposed to light to form the chemical latent image of the document and to remove portions of the developer S from the image forming surface of the capsule web 13 according to the original picture.

As shown in FIG. 3, the developer removing electrode 26 has a laminate construction consisting of a photoconductive member 25 and a back plate 26A.

The photoconductive member 25 is formed of a transparent organic photoconductive material. The photoconductive member 25 has a photosensitive characteristic that the potential drops sharply with exposure, namely, the photoconductive member 25 has a large gamma. Accordingly, the portions of the photoconductive member 25 exposed to intense light become conductive.

The back plate 26A is a transparent electrode formed of ITO (an oxide of indium and tin) or tin dioxide. The back plate 26A is connected to the positive electrode of a dc power source E2.

The counter electrode 27 is disposed opposite to the developer removing electrode 26 with a predetermined space therebetween. The capsule web 13 having the surface entirely coated with the developer S is passed through the space between the counter electrode 27 and the developer removing electrode 26 with the surface coated with the developer S facing the developer removing electrode 26. The counter electrode 27 is a transparent electrode formed of ITO or tin dioxide and is connected to the positive terminal of a dc power source E3.

The recovery box 31 contains the developer S selectively removed from the portions of the capsule web 13. A brush 31A provided in the recovery box 31 is driven by driving means, not shown, to remove the developer S adhering to the developer removing electrode 26. The developer removed from the developer removing electrode 26 is captured in the recovery box 31.

As shown in FIG. 2, the light beam splitter 28 comprises an image forming lens 17, a semitransparent mirror 60, three mirrors 61, and a Dove prism 62. The light beam splitter 28 splits the reflected light, reflected by the surface of the document and transmitted through the image forming lens 17, into two light beams by means of the semitransparent mirror 60. One of the split light beams is projected directly onto the counter electrode 27, and the other split light beam is inverted by the three mirrors 61 and the Dove prism 62 and then the resultant inverted split light beam is projected from behind the back plate 26A onto the developer removing electrode 26. The light splitter 28 is adjusted so that the images formed by the split light beams on the developer removing electrode 26 and the counter electrode 27 coincide with each other.

The pressure-developing unit 40 comprises a pair of opposing developing rollers 41. The pressure-developing unit 40 applies pressure to the capsule web 13, processed by the developer exposing/removing unit 30, between the developing rollers 41 for pressure-development.

A sheet cassette 70, containing a stack of ordinary recording sheets 71, is disposed between the developer exposing/removing unit 30 and the pressure-developing unit 40. The recording sheets 71 are removed one at a time from the sheet cassette 70 along a transportation guide 74 to the pressure-developing unit 40. The recording sheet 71 and the capsule web 13 carrying the chemical latent image coated with the developer S are brought together in the pressure-developing unit 40, the superposed recording sheet 71 and the capsule web 13 being compressed between the developing rollers 41. Consequently, the microcapsules which have not set collapse to shed the color precursor and the color precursor and the developer S interact to develop a color that forms a visible image on the recording sheet 71.

The fixing unit 50 is provided internally with a heater to fix the visible image to the recording sheet 71 by heating the recording sheet 71 carrying the visible image.

After the visible image has been fixed to the recording sheet 71, the recording sheet 71 is ejected from the image recording apparatus through the outlet opening 3.

The operation of the image recording apparatus in the first embodiment will be described hereinafter with reference to FIGS. 1 to 3.

The capsule web 13 as it unwinds from a capsule web roll 10, is moved toward the developer applying unit 20 and enters the developer applying unit 20 through the inlet opening 20B formed in the casing 20A. The developer feed roller 22 is rotated in the toner box 21 to negatively electrify the developer S by friction between the developer S and the developer feed roller 22. The negatively electrified developer S adheres to the surface of the developer feed roller 22. The developer S adhering to the surface of the developer feed roller 22 is subjected to electrostatic force in a region nearest to the developer applying roller 23 because the developer applying roller is connected to the positive terminal of the dc power source E1 and, consequently, the developer S adhering to the surface of the developer feed roller 22, is transferred to the surface of the capsule web 13 to coat the image forming surface of the capsule web 13 with the developer S. Then, the capsule web 13, coated with the developer S, is transported out of the casing 20A through the outlet opening 20C and is fed into the developer exposing/removing unit 30 by the guide rollers 14.

To start the process, a document (not shown) is supported on the document support table 2 with the surface having the original picture in contact with the contact glass, a start button (not shown) is depressed, and the exposure lamp 16 emits light.

The light emitted by the exposure lamp 16 is reflected by the original picture of the document supported on the document support table 2. The light beam reflected by the document travels through the image forming lens 17 and is split into two light beams by the light beam splitter 28.

As shown in FIG. 3, one of the two split light beams (the upper split light beam) is projected from behind the transparent counter electrode 27 onto the capsule web 13. Since the capsule web 13 is formed by coating a transparent backing with the numerous dye precursor containing microcapsules, the microcapsules are exposed to the split light beam transmitted through the backing to form a chemical latent image of the original picture on the surface of the capsule web 13 coated with the microcapsules.

At the same time, the other split light beam (the lower split light beam) is projected onto the photoconductive member 25 from behind the back plate 26A. Portions of the photoconductive member 25 corresponding to the blank portions of the original picture become conductive portions 25A, whereas portions of the photoconductive member 25 corresponding to the colored or black portions of the original picture do not become conductive because the photoconductive member 25 has a high gamma. Consequently, the intensity of an electric field created between the back plate 26A and the counter electrode 27 in regions corresponding to the conductive portions 25A is enhanced and the developer S coating portions of the capsule web 13 corresponding to the conductive portions 25A are removed from the capsule web 13 to adhere to the photoconductive member 25. Thus, portions of the capsule web 13 corresponding to the blank portions of the document are not coated with the developer S and the desired portions of the capsule web 13 are coated selectively, uniformly and satisfactorily with the developer S.

The developer S adhering to the photoconductive member 25 is brushed off the photoconductive member 25 with the brush 31A after every recording cycle and the developer S thus removed from the photoconductive member 25 is recovered into the recovery box 31.

Then, the capsule web 13, having the portions selectively coated with the developer S, is advanced by guide rollers 15 to the pressure-developing unit 40. At the same time, a recording sheet 71 is removed from the sheet cassette 70 by sheet feed rollers 73. The recording sheet 71 is delivered along a guide 74 to the pressure-developing unit 40. The capsule web 13 coated with the developer S and the recording sheet 71 are brought together and compressed between the developing rollers 41 for pressure-development. Then, the microcapsules which have not set collapse to shed the color precursor. The developer S and the color precursor shed from the microcapsules interact to develop a color and the color is transferred to the recording sheet 71 in a pattern corresponding to the original picture to form an image of the original picture.

Then, the recording sheet 71 carrying the image is subjected to heat-setting in the fixing unit 50 to fix the image to the recording sheet 71. Finally, the recording sheet 71 carrying the fixed image is ejected from the image recording apparatus through the outlet opening 3. The used capsule web 13 is received on a winding roll 11.

Thus, the image recording apparatus in the first embodiment completes the image recording operation.

An image recording apparatus in a second embodiment according to the invention provided with a powder applying device will be described hereinafter. In this embodiment the powder is also a developer that reacts with a color precursor contained in microcapsules to develop a color. This image recording apparatus provided with the developer applying device is capable of using again the developer S recovered from a capsule web 93.

Figure 4:
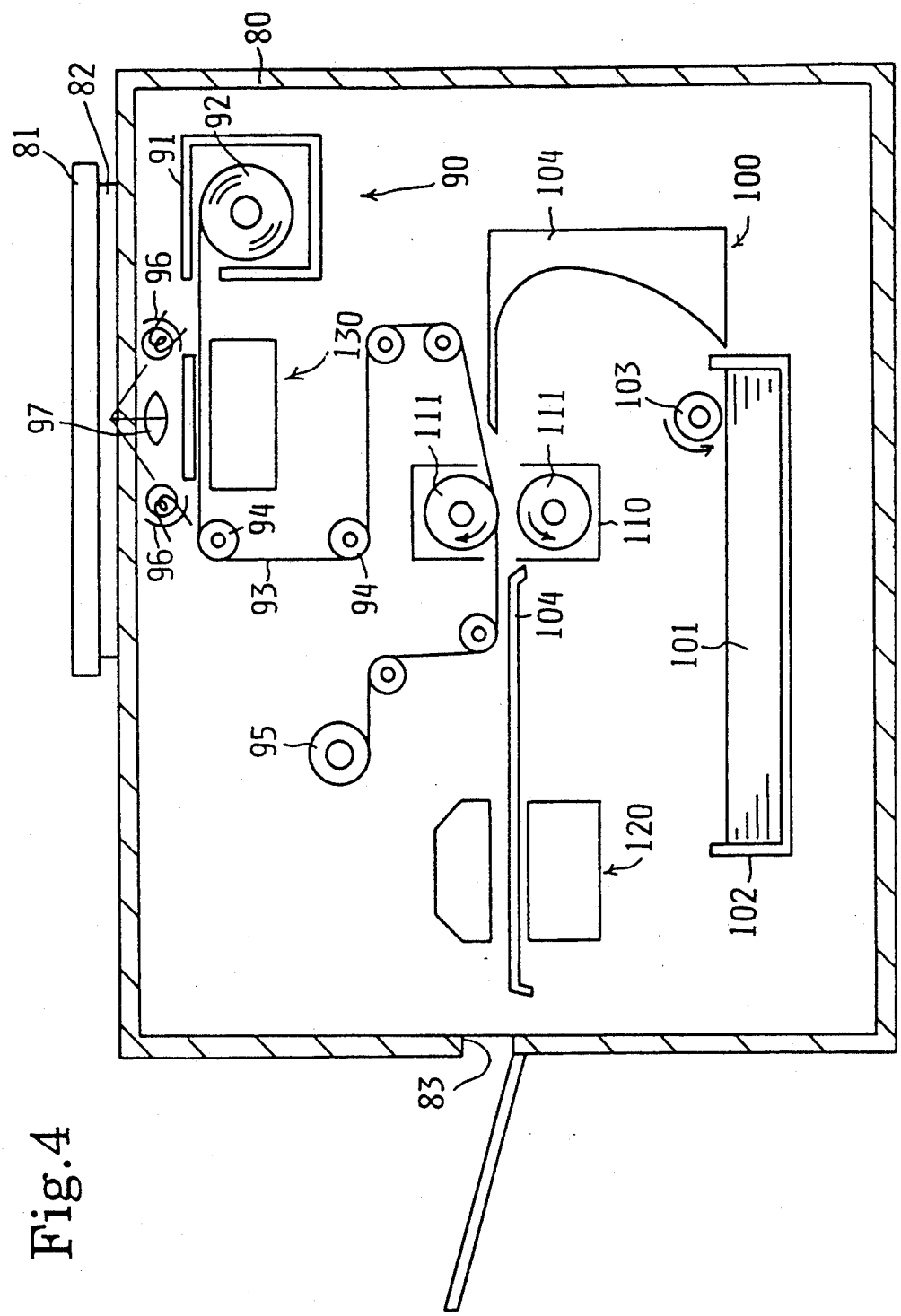
FIG. 4 is a schematic view of an image recording apparatus in a second embodiment according to the invention.
Figure 5:
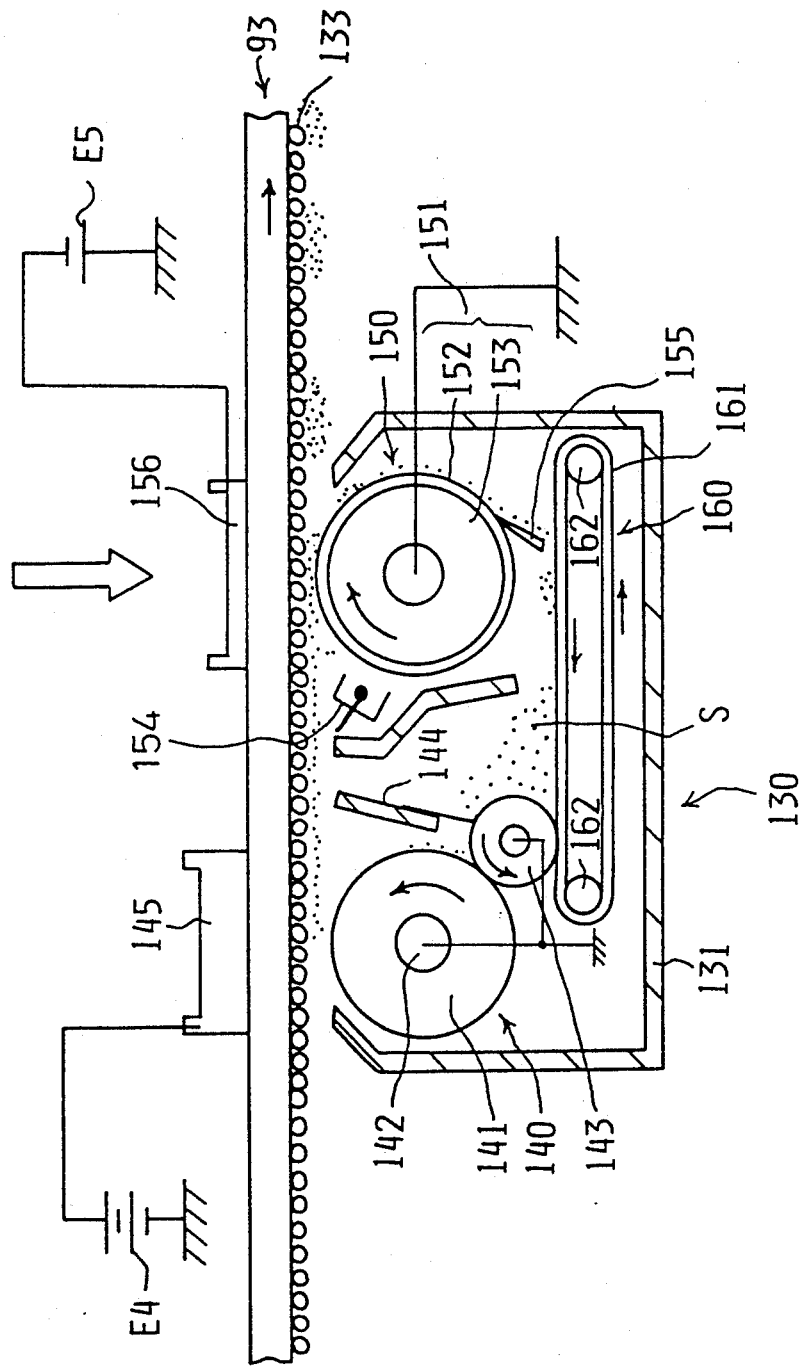
FIG. 5 is an enlarged view of a powder removing unit included in the image recording apparatus of FIG. 4.

The general structure of the image recording apparatus in the second embodiment provided with the developer applying device will be described with reference to FIGS. 4 and 5. FIG. 4 is a view showing the general structure of the image recording apparatus in the second embodiment and FIG. 5 is a view showing the general structure of a developer applying unit included in the image recording apparatus in the second embodiment.

The image recording apparatus has a document support table 82 provided on the upper wall of a housing 80. An outlet opening 83 for ejecting a completed recording sheet therethrough is formed in a side wall of the housing 80. The document support table 82 reciprocates laterally in synchronism with the transportation of the capsule web 93 and the rotation of a photoconductive roller 151.

A capsule web exposing/feeding unit 90, a recording sheet transporting unit 100, a pressure-developing unit 110, a fixing unit 120 and developer applying unit 130 are housed in the housing 80.

The capsule web exposing/feeding unit 90 comprises a cassette 91, a plurality of guide rollers 94 and an exposure unit, and is disposed in an upper section of the interior of the housing 80.

The cassette 91 contains a roll 92 of the capsule web 93 having the shape of an elongated strip. The capsule web is formed by coating a transparent base strip with numerous microcapsules. The capsule web 93 pulled out from the cassette 91 is advanced by the plurality of rotating guide rollers 94 and, finally, taken up on a winding roller 95.

The exposure unit comprises at least one exposure lamp 96 and a lens 97.

The exposure lamp 96 illuminates a document 81 supported on the document support table 82 with a surface carrying an original picture in contact with the contact glass of the document support table 82. A light beam reflected by the surface of the document 81 carries image information.

The lens 97 transmits the reflected light beam and focuses the same on the image forming surface of the capsule web 93 coated with the microcapsules. The reflected light beam transmitted through the lens 97 is transmitted further through a transparent electrode 156 and focused on the image forming surface of the capsule web 93 coated with the microcapsules to form a chemical image of the original picture on the image forming surface of the capsule web 93.

The sheet transporting unit 100 comprises a recording sheet cassette 102 containing a stack of ordinary recording sheets 101, a sheet feed roller 103 and a guide 104, and is disposed in the lower section of the interior of the housing 80.

The sheet feed roller 102 is always in contact with the top recording sheet 101 among the recording sheets 101 contained in the sheet cassette 102. In feeding out the recording sheet 101 from the sheet cassette 102, the sheet feed roller 103 is rotated in the direction of the arrow to frictionally feed the recording sheets 101, one at a time, toward the guide 104. The recording sheet 101 travels along the guide 104 to the pressure-developing unit 110.

The pressure-developing unit 110 has a pair of opposing developing rollers 111. The capsule web 93 having portions selectively coated with the developer, and the recording sheet 101 transported by the sheet transporting unit 100, are brought together and compressed between the pair of developing rollers 111 and, consequently, the microcapsules which have not been exposed to light, and have not set, collapse to shed the color precursor contained therein. The developer and the color precursor interact to develop a color, which is transferred to the recording sheet 101 to form an image on the recording sheet 101.

The fixing unit 120 is provided with a heater (not shown) that is disposed after the pressure-developing unit 110 with respect to the sheet transporting direction. The image formed on the recording sheet 101 by the pressure-developing 110 is fixed to the recording sheet 101 by heating.

The developer applying unit 130 is disposed below the exposure unit. The developer applying unit 130 will be described hereinafter with reference to FIG. 5.

The developer applying unit 130 comprises a developer applying mechanism 140 for applying the developer S over the entire surface of the capsule web 93, a developer removing mechanism 150 for selectively removing the developer S from portions of the capsule web 93, a conveying mechanism 160 for conveying the developer S removed from the capsule web 93 by the developer removing mechanism 150 to the developer applying mechanism 140, and a casing 131 containing those mechanisms.

The developer applying mechanism 140 comprises a developer carrying roller 141, a developer feed roller 143, a doctor blade 144 for regulating the thickness of a layer of the developer S formed over the developer feed roller 143, and a developer applying electrode 145.

The developer carrying roller 141 is supported in the casing 131 opposite to the developer applying electrode 145 with a space therebetween. The capsule web 93 is passed through the space between the developer carrying roller 141 and the developer applying electrode 145 with the surface coated with the microcapsules 133 facing the developer carrying roller 141. The developer carrying roller 141 is formed of a metal, such as a steel or aluminum, and is coated with a dielectric film of a polymeric material. The surface of the developer carrying roller 141 is grooved or matted to facilitate carrying the developer S. The shaft 142 of the developer carrying roller 141 is connected to a driving mechanism (not shown) which drives the developer carrying roller 141 in the direction of the arrow shown in FIG. 5. The shaft 142 of the developer carrying roller 141 is grounded.

The developer feed roller 143 is disposed in contact with the developer carrying roller 141. The developer feed roller 143 consists of a shaft and a rubber sponge roller body. A driving mechanism (not shown) is connected to the shaft of the developer feed roller 143 to drive the developer feed roller 143 for rotation in the direction of the arrow shown in FIG. 5. As the developer feed roller 143 is rotated, the developer S is electrified negatively by friction between the rubber sponge roller body and the developer S and adheres to the surface of the developer feed roller 143. The negative charge of the developer S adhering to the surface of the developer feed roller 143 is enhanced by friction between the developer S and the surface of the developer carrying roller 141 and the developer S is transferred from the developer feed roller 143 to the developer carrying roller 141. As the developer carrying roller 141 rotates, the developer S adhering to the surface of the developer carrying roller 141 approaches the image forming surface of the capsule web 93 coated with the microcapsules 133. The shaft of the developer feed roller 143 is grounded.

The doctor blade 144 is held fixedly with the edge thereof positioned very close to the surface of the developer feed roller 143 to keep the thickness of the layer of the developer S adhering to the surface of the developer feed roller 143 constant and to smooth the surface of the layer of the developer S.

The developer applying electrode 145 is formed of a metal, such as a steel or aluminum. As mentioned above, the developer applying electrode 145 is disposed opposite to the developer carrying roller 141 with a predetermined space therebetween. The developer applying electrode 145 is connected to the positive terminal of a dc power source E4.

The developer removing mechanism 150 comprises a photoconductive roller 151, a charger 154, a developer removing blade 155, and a transparent electrode 156.

The photoconductive roller 151 consists of a grounded metal shaft, a metal roller body 153 supported on the shaft, and a photoconductive layer 152 formed of an OPC (organic photoconductor) coating the circumference of the metal roller body 153. A driving mechanism (not shown) is connected to the metal shaft to drive the photoconductive roller 151 for rotation in the direction of the arrow shown in FIG. 5.

The charger 154 is disposed near the circumference of the photoconductive roller 151 to charge the photoconductive layer 152 negatively. The charger 154 is of a corotron system.

The developer removing blade 155 is disposed near the circumference of the photoconductive roller 151 with its edge in close contact with the surface of the photoconductive layer 152 to scrape the developer S adhering to the surface of the photoconductive roller 151 off the same.

The transparent electrode 156 is disposed opposite to the photoconductive roller 151 with a predetermined space therebetween. The capsule web 93 is passed through the space between the transparent electrode 156 and the photoconductive roller 151. The light beam reflected by the document is transmitted through the lens 97, the transparent electrode 156 and the transparent backing of the capsule web 93 and falls on the image forming surface coated with the microcapsules 133 to form an image thereon. The transparent electrode 156 is connected to the negative terminal of a dc power source E5.

The conveying mechanism 160 is disposed below the developer applying mechanism 140 and the developer removing mechanism 150. The conveying mechanism 160 comprises an endless conveyor belt 161 and a pair of drive rollers 162 for driving the conveyor belt 161. A driving mechanism (not shown) drives the drive roller 162 so that the conveyor belt 161 is turned in the direction of the arrow shown in FIG. 5. The conveyor belt 161 is in contact with the developer feed roller 143.

The operation of the developer applying device will be described hereinafter with reference to FIGS. 4 and 5.

A document 81 is placed on the document support table 82 with a surface having an original picture in contact with the contact glass. When a start button (not shown) is depressed, the capsule web exposing/feeding unit 90 starts feeding the capsule web 93 and, at the same time, the developer applying unit 130 starts operating.

The developer carrying roller 141 and the developer feed roller 143 of the developer applying mechanism 140 are driven by the driving mechanism (not shown) for counterclockwise rotation as shown in FIG. 5. Then, the developer S is electrified negatively by friction between the surface of the developer feed roller 143 and the developer S, and the negatively electrified developer S adheres to the surface of the developer feed roller 143.

The doctor blade 144 scrapes off the excessive developer S from the surface of the developer feed roller 143 to maintain the thickness of the layer of the developer S coating the surface of the developer feed roller 143 at a predetermined thickness and to smooth the surface of the layer of the developer S. Thus, the developer feed roller 143 is always charged negatively and feeds the layer of the developer S, having a constant thickness and a smooth surface, to the developer carrying roller 141. Then, the negative charge of the developer S is increased by the friction between the layer of the developer S coating the surface of the developer feed roller 143 and the surface of the developer carrying roller 141.

The developer S is transferred from the surface of the developer feed roller 143 to the surface of the developer carrying roller 141 to form a satisfactory layer of the developer S over the surface of the developer carrying roller 141. Since the developer applying electrode 145 is connected to the positive terminal of the dc power supply E4, the negatively charged developer S is drawn from the surface of the developer carrying roller 141 to the capsule web 93 to coat the surface of the capsule web 93 uniformly with the developer S.

The capsule web 93, having the image forming surface uniformly coated with the developer S, is advanced to a position opposite the developer removing mechanism 150. The photoconductive layer 152 is charged negatively by the charger 154. The exposure lamp 96 illuminates the document 81 supported on the document support table 82. The reflected light beam reflected by the document 81 is transmitted through the lens 97 and the transparent electrode 156 and is focused on the image forming surface of the capsule web 93.

As mentioned above, the document support table 82 is moved laterally by a driving mechanism, not shown, in synchronism with the movement of the capsule web 93 and the rotation of the photoconductive roller 151. Accordingly, a chemical latent image of the original picture is formed on the image forming surface of the capsule web 93 coated with the microcapsules. At the same time, the light beam transmitted through the capsule web 93 falls on the surface of the photoconductive layer 152 and, consequently, the negative charge of portions of the photoconductive layer 152 irradiated with the light beam is reduced, so that an electrostatic latent image of the original picture is formed on the photoconductive layer 152 and electrostatic latent image that is comprised of negatively charged portions corresponding to the dark portions of the original picture and grounded portions corresponding to the bright portions of the same are formed on the photoconductive layer 152.

The portions of negatively charged developer S coated on the capsule web 93 corresponding to the grounded portions of the photoconductive layer 152 are attracted to the photoconductive layer 152 and the negatively charged portions of the photoconductive layer 152 repulse the developer S coating those portions of the capsule web 93 corresponding to the negatively charged portions of the photoconductive layer 152, so that the developer S coating those portions of the capsule web 93 remains on the capsule web 93. Thus, the portions of the capsule web 93 are coated selectively with the developer S.

The photoconductive roller 151, which has removed the developer S selectively from portions of the capsule web 93, is rotated by the driving mechanism (not shown) and the developer removing blade 155 scrapes the developer S off the photoconductive layer 152 of the photoconductive roller 151.

The developer S removed from the photoconductive layer 152 of the photoconductive roller 151 falls on the conveyor belt 161 and is conveyed to the developer applying mechanism 140 by the conveyor belt 161. Then, the developer S, thus recovered, is negatively electrified again by friction and is used to coat another portion of the image forming surface of the capsule web 93. Accordingly, if the original picture has a small area and the portions of the image forming surface of the capsule web 93 to be coated with the developer S have a small area, most of the developer S applied to the entire image forming surface of the capsule web 93 is recovered and used again. Thus, the image recording apparatus in the second embodiment is able to operate more efficiently and more economically than the image recording apparatus in the first embodiment.

The capsule web 93 having the portions selectively coated with the developer S, and carrying the chemical latent image, is guided by the guide rollers 94 to the pressure-developing unit 110. At the same time, a recording sheet 101 is fed from the sheet cassette 102 by the sheet feed roller 103 and the recording sheet 101 is delivered along the guide 104 to the pressure-developing unit 110.

Then, the recording sheet 101 and the capsule web 93, having the portions selectively coated with the developer S, are brought together and the recording sheet 101 and the capsule web 93 are compressed between the developing rollers 111 for pressure-development. The microcapsules which have not been exposed to light, and have not set, collapse to shed the color precursor. The color precursor and the developer S interact to develop a color that is transferred to the recording sheet 101 to form an image corresponding to the original picture on the recording sheet 101.

Subsequently, the recording sheet 101 is separated from the capsule web 93, the capsule web 93 is taken up on the winding roller 95, and the recording sheet 101 is transported along the guide 104 to the fixing unit 120. The fixing unit 120 heat-fixes the image to the recording sheet 101. Then, the recording sheet carrying the fixed image is ejected through the outlet opening 83.

Thus, the image recording apparatus provided with the developer applying device in the second embodiment completes the image recording operation.

A method of recording an image of an original picture on a recording medium will be described hereinafter with reference to FIGS. 6 to 9. This method forms an image on a recording medium by applying powder to portions of photosensitive, pressure-sensitive recording medium selectively. The powder is a developer which reacts with a color precursor contained in microcapsules to develop a color.

Figure 6:
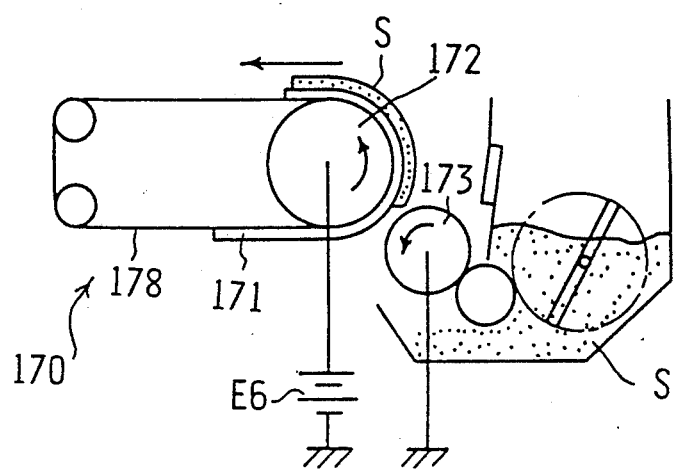
FIG. 6 is a view of assistance in explaining a process of applying a developer on a photosensitive, pressure-sensitive recording medium.
Figure 7:
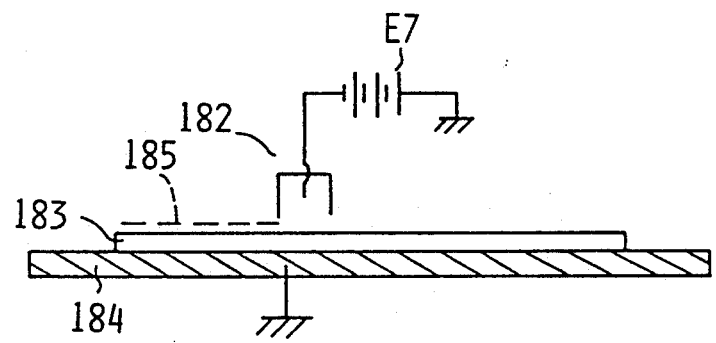
FIG. 7 is a view of assistance in explaining a process of charging a photoconductive member.
Figure 8:
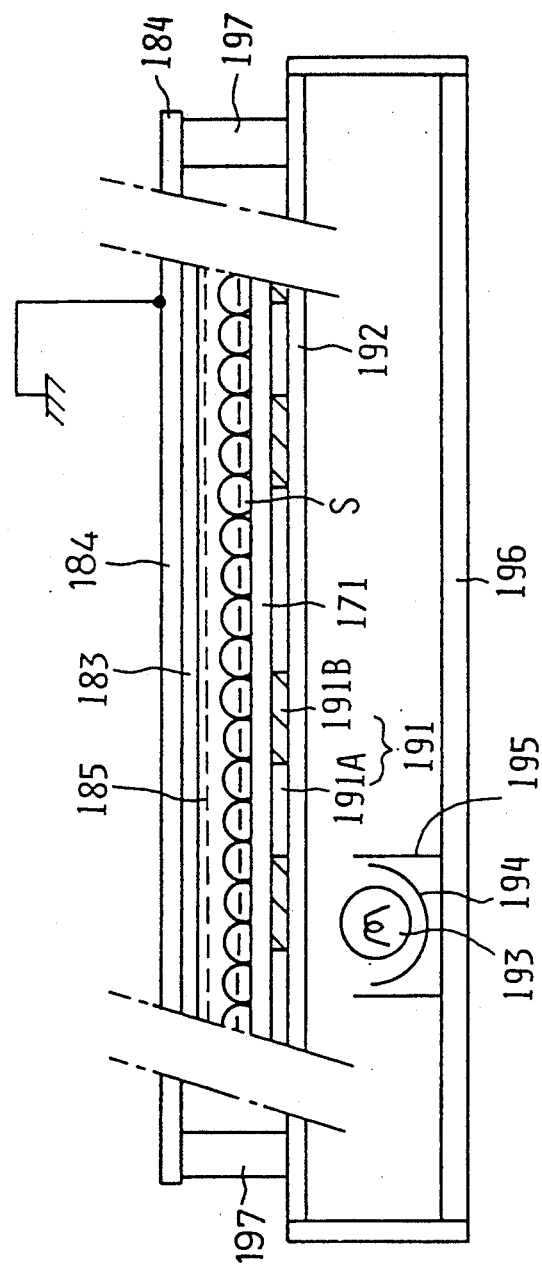
FIG. 8 is a view of assistance in explaining a process of disposing a document and a photosensitive, pressure-sensitive recording medium opposite to each other.
Figure 9:
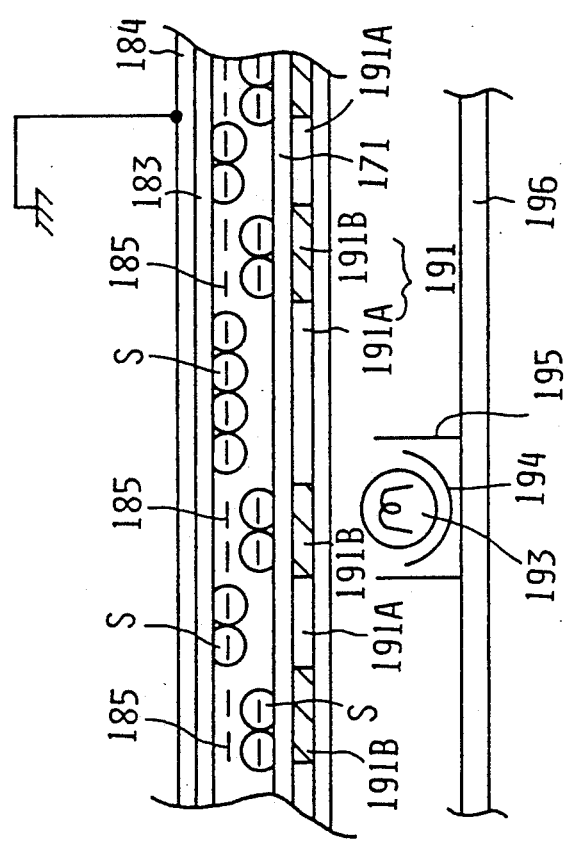
FIG. 9 is a view of assistance in explaining a process of forming a chemical latent image of an image on a photosensitive, pressure-sensitive recording medium and selectively removing developer from the photosensitive, pressure-sensitive recording medium.

First, steps of the image recording method in this embodiment will be described sequentially with reference to FIGS. 6 to 9. FIG. 6 is a view of assistance in explaining a step of applying a developer to a photosensitive, pressure-sensitive recording medium, FIG. 7 is a view of assistance in explaining a step of previously charging a photoconductive member, FIG. 8 is a view of assistance in explaining a step of disposing a document and a photosensitive, pressure-sensitive recording medium opposite to one another, and FIG. 9 is a view of assistance in explaining a step of forming a chemical latent image of the picture on the photosensitive, pressure-sensitive recording medium and removing the developer selectively from portions of the photosensitive, pressure-sensitive recording medium.

A step of applying the developer S, i.e., the powder, to the entire image forming surface of a capsule sheet 171 coated with microcapsules will be described hereinafter. The developer S is applied to the capsule sheet 171, for example of a size A4 as internationally defined, by the developer applying device 170 shown in FIG. 6. The capsule sheet 171, which is similar to the foregoing capsule webs 13 and 93, is formed by coating a surface of a transparent backing with numerous microcapsules. The developer applying device is identical with that previously disclosed in Japanese Utility Model Laid-open (Kokai) No. 2-90838 and hence the detailed description thereof will be omitted.

The negatively charged powdery developer S adheres to and is carried by a developer carrying roller 173. The developer carrying roller 173 is grounded. A conveyor belt 178 is extended around an electrode roller 172 and two auxiliary rollers. The capsule sheet 171, in close contact with the conveyor belt 178, is conveyed by the conveyor belt 178. The electrode roller 172 is connected to the positive terminal of a dc power source E6 so that the developer S, adhering to the surface of the developer carrying roller 173, is attracted and drawn from the surface of the developer carrying roller 173 toward the electrode roller 172 to coat the surface of the capsule sheet 171 entirely with the developer S.

The capsule sheet 171 is formed by coating a surface of a 25 $\mu$m thick transparent polyethylene terephthalate film (PET film) with microcapsules. The dc power source E6 creates an electric field of an intensity in the range of 2 to 3 kV/mm in the space between the electrode roller 172 and the developer carrying roller 173 to enable the negatively charged developer S to coat the surface of the capsule sheet 171 uniformly.

A step of charging an OPC photoconductive member 183 will be described hereinafter. As shown in FIG. 7, the OPC photoconductive member 183 having the shape of a sheet and formed by coating a transparent film with a transparent electrode and a photoconductive organic material was placed on a grounded base 184 so that the transparent electrode is connected electrically to the base 184. Then, a movable corotron 182, placed above the OPC photoconductive member 183 is connected to the negative terminal of −6 kV of a dc power source E7. The corotron 182 is moved along the surface of the OPC photoconductive member 183 to give a uniformly negative charge 185 to the surface of the OPC photoconductive member 183. In this state, the surface potential of the OPC photoconductive member 183 is about −600 V.

A step of placing the capsule sheet 171, having the image forming surface entirely coated with the developer S, adjacent the negatively charged OPC photoconductive member 183 will be described hereinafter. As shown in FIG. 8, a document 191, such as a color print, is placed on a glass plate 192 and a capsule sheet 171 is placed on the document 191 with its image forming surface coated with the developer S facing up. Then, the photoconductive member 183 is disposed over the capsule sheet 171 with the surface having the charge 185 facing down and with a space of a thickness in the range of 0.3 to 1 mm therebetween. Spacers 197 can be used to maintain the appropriate gap between photoconductive member 183 and capsule sheet 171.

An exposure light source 195 comprising a halogen lamp 193 is supported under the glass plate 192 for lateral movement along a guide rail 196. Indicated at 194 is a reflecting plate. Since the developer S coating the capsule sheet 171 and the photoconductive member 183 are charged negatively, a repulsive force acts between the developer S and the photoconductive member 183, so that the developer S remains on the capsule sheet 171.

The steps of forming a chemical latent image of the document 191 on the image forming surface of the capsule sheet 171 coated with the microcapsules and removing the developer S selectively from portions of the capsule sheet 171 will be described hereinafter. As shown in FIG. 9, the exposure light source 195 is turned on and the exposure light source 195 is moved laterally along the guide rail 196 to illuminate the capsule sheet 171 from its backside through the document 191. Light, transmitted through blank portions 191A of the document 191 cause the microcapsules, not shown, exposed thereto to set, travels through the layer of the developer S and falls on the photoconductive member 183. Since the photoconductive layer of the photoconductive member is grounded, the charge 185 in portions of the photoconductive member 183 exposed to the light disappears and the potential of the same portion drops to about zero V. Consequently, the developer S is transferred from the capsule sheet 171 to the photoconductive member 183 by an image force acting between the negatively charged developer S and the surface of the photoconductive member 183. The light emitted by the exposure light source 193 is unable to penetrate image portions 191B of the document 191, therefor the microcapsules coating portions of the capsule sheet 171 corresponding to the image portions 191B do not set and the charge 185 in portions of the photoconductive member 183 corresponding to the image portions 191B remains unchanged. Consequently, the developer S coating the same portions of the capsule sheet 171 is not removed.

The capsule sheet 171 thus processed and an ordinary recording sheet are brought together and subjected to pressure-development. A pressure-developing device used for development is similar to that disclosed in Japanese Utility Model Laid-open (Kokai) No. 2-90838 and hence the description thereof will be omitted. The recording sheet is separated from the capsule sheet 171 after pressure-development with the image formed on the recording sheet.

Figure 10:
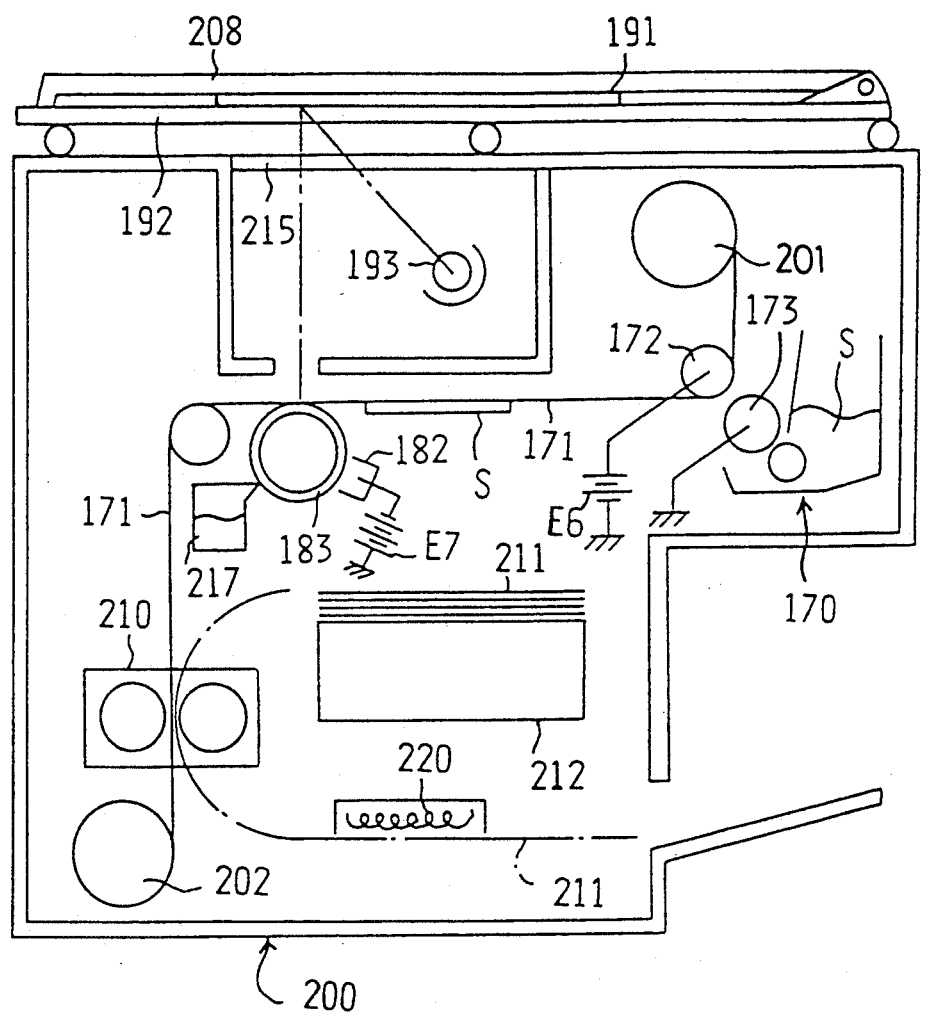
FIG. 10 is a schematic view of an image recording apparatus in a third embodiment according to the invention.

The operation of an image recording apparatus provided with a developer applying device in a third embodiment according to the present invention for carrying out the foregoing image recording method will be described hereinafter with reference to FIG. 10, in which parts like or corresponding to those used in the explanation of the foregoing image forming method are denoted by the same reference characters. This embodiment uses a capsule web 171 instead of capsule sheets.

A document 191 is placed on a document support table with its picture carrying surface in contact with the contact glass of the document support table, a cover 208 is closed over document 191, and the start button (not shown) of the image recording apparatus 200 is depressed to start an image recording operation. Then, the capsule web 171, pulled from a roll 201 of the capsule web 171, is advanced toward an electrode roller 172 connected to the positive terminal of a dc power source E6. A developer carrying roller 173 disposed near the electrode roller 172 carries a negatively charged developer S. The developer S is drawn from the developer carrying roller 173 to the capsule web 171 by the agency of an electric field created between the electrode roller 172 and the developer carrying roller 173 to coat the surface of the capsule web 171 uniformly. This process is a developer applying process.

The capsule web 171 is advanced further to a photoconductive drum 183. The surface of the photoconductive drum 183 has been previously charged with a corotron 182, a charger, connected to the negative terminal of a dc power source E7. This process is a charging process.

Then, a halogen lamp 193 is turned on to emit light. The light emitted by the halogen lamp 193 travels through a slit 215 and a contact glass 192 and falls on the picture surface of the document 191. The picture surface of the document 191 reflects the light onto the photoconductive drum 183 through the capsule web 171 coated with the developer S. The polarity of the dc power source E7 is determined so that the photoconductive drum 183 is charged with the same polarity as that of the charged developer S. Accordingly, as previously explained, a chemical latent image of the document is formed on the image forming surface of the capsule web 171 coated with the microcapsules, and the developer S coating portions of the capsule web 171 corresponding to blank portions of the document are removed from the capsule web 171 and transferred from the capsule web 171 to the photoconductive drum 183. The developer S transferred to the photoconductive drum 183 is removed from the photoconductive drum 183 by a cleaning unit 217 for recovery. This process is a developer exposing/removing process.

The capsule web 171 is advanced further toward a developing unit 210. A recording sheet 211 is fed from a sheet cassette 212 and delivered successively to the developing unit 210 in time with the exposed portion of capsule web 171. The recording sheet 211 and the portion of the capsule web 171 having the chemical latent image are brought together and compressed in the developing unit 210. The microcapsules which have not been exposed to the light and have not set, collapse to shed a color precursor and the color precursor and the developer S interact to develop a color image on the recording sheet. Then, the recording sheet 211 is separated from the capsule web 171, the capsule web 171 is taken up by a winding cartridge 202, the image is heat-fixed to the recording sheet 211 by a fixing unit 220, and then the recording sheet 211 is ejected from the image recording apparatus.

The invention is not limited to the foregoing embodiments in its practical application, and many changes and variations are possible therein without departing from the scope and spirit thereof.

For example, in the first embodiment, it is possible to omit the light beam splitter 28 by employing a procedure including exposing the capsule web 13 to light for exposure, disposing the capsule web 13 opposite to the developer removing electrode 26, and exposing the capsule web 13 to light again for exposure. When such a procedure is employed, the backing of the capsule web 13 may be an opaque one.

The conveyor belt for recovering the developer employed in the second embodiment may be substituted by other mechanical conveying means, such as a roller or a screw conveyor, vibratory conveying means, or electrical means, such as an electrostatic curtain.

Although the first, second and third embodiments have been described as applied to dealing with a photosensitive, pressure-sensitive medium and the developer, these embodiments are applicable also, for example, to coating the surface of a capsule web, having dye-containing microcapsules thereon, with a dye-absorbing layer of white powder, such as powder of clay, calcium carbonate or titanium dioxide. That is, the dye-absorbing layer is applied like the developer of the first, second and third embodiments.

Corona discharge of a corotron or scorotron employed in the third embodiment for uniformly charging the photoconductive member in the charging process may be substituted by a brush or roller connected to a power source and placed in contact with the photoconductive member.

A laser beam emitted by a semiconductor laser may be employed in the developer exposing/removing process in the third embodiment.

Although the capsule web is exposed to light falling thereon from behind in the third embodiment, the capsule web may be exposed to light transmitted through the photoconductive member for the same effect. This method is possible if an exposure light source, such as a semiconductor laser, is disposed within the photoconductive drum 183 shown in FIG. 10.

The microcapsules coating the capsule sheet and the capsule web, i.e., photosensitive, pressure-sensitive recording media employed in the first, second and third embodiments may be such as those containing a coloring matter or a pigment. When such microcapsules are employed, powder appropriate to forming an image is provided as a powdery dye-absorbing material.

Although the first, second and third embodiments apply a developer which reacts with the content of the microcapsules to develop a color to the capsule web or the capsule sheet, a powdery material or particles other than the developer or a powdery material that colors the microcapsules may be applied to the capsule web or the capsule sheet. Further, the microcapsules themselves may be the particles applied to web having a dye absorbing material or a developer applied thereto.

What is claimed is:

1. An image recording apparatus incorporating a selective powder applying device for recording an image on a recording medium according to image information, comprising:

a photosensitive, pressure-sensitive recording medium;

powder applying means for applying charged powder to the entire surface of the photosensitive, pressure-sensitive recording medium;

a powder removing electrode for selectively removing powder from the photosensitive, pressure-sensitive recording medium, and having a laminate construction comprising a photoconductive member and a back plate to which a voltage is applied, said powder removing electrode disposed near the image forming surface of the photosensitive, pressure-sensitive recording medium coated with the powder with a predetermined space therebetween;

light splitting means for splitting a light beam carrying image information to irradiate the photosensitive, pressure-sensitive recording medium and the photoconductive member of the powder removing electrode individually with the split light beams to create conductive portions on the photoconductive member corresponding to blank portions of the image information;

pressure-developing means for forming an image on the recording medium by superposing the photosensitive, pressure-sensitive recording medium, after it has passed the powder removing electrode and the recording medium, by compressing the superposed photosensitive, pressure-sensitive recording medium and the recording medium; and fixing means for fixing an image on the recording medium by heating the recording medium carrying the image.

2. The image recording apparatus according to claim 1, wherein said photosensitive, pressure-sensitive recording medium comprises a transparent backing with numerous microcapsules coated thereon.

3. The image recording apparatus according to claim 2, wherein said microcapsules encapsulate therein a chromogenic material and a photosensitive material which changes mechanical strength according to the amount of the irradiated light.

4. The image recording apparatus according to claim 1, wherein said photoconductive member and said back plate have a transparent characteristic.

5. The image recording apparatus according to claim 4, wherein said back plate is connected to a DC power supply having an opposite polarity of the charged powder.

6. The image recording apparatus according to claim 1, said image recording apparatus further comprising a counter electrode that is disposed opposite to said powder removing electrode with a predetermined space therebetween.

7. The image recording apparatus according to claim 6, wherein said counter electrode has a transparent characteristic and is connected to a DC power supply having an opposite polarity of the charged powder.

8. The image recording apparatus according to claim 7, wherein said light splitting means comprises an image forming lens, a semitransparent mirror, three mirrors, and a Dove prism, and said light beam carrying image information is split into two split light beams by said semitransparent mirror, one of the split light beams being projected directly on said counter electrode and the other split light beam being inverted by said three mirrors and said Dove prism, said inverted split light beam being projected from behind said back plate on said powder removing electrode.

9. A selective particle applying device for applying particles onto a supporting member according to image information, comprising:

particle applying means for applying charged particles to the entire surface of the supporting member;

particle removing means for selectively removing particles from the supporting member comprising a particle removing electrode having a laminate construction including a photoconductive member and a conductive member to which a voltage is applied, said photoconductive member disposed near the surface of the supporting member coated with the particles with a predetermined space therebetween; and light irradiating means for irradiating at least the photoconductive member of the particle removing means with a light beam carrying image information to create conductive portions of the photoconductive member corresponding to blank portions of the image information.

10. A selective particle applying device for applying particles onto a supporting member according to image information, comprising:

particle applying means for applying charged particles to the entire surface of the supporting member;

a particle removing means for selectively removing particles from the supporting member comprising a particle removing electrode having a laminate construction including a photoconductive member and a back plate to which a voltage is applied, said particle removing electrode disposed near the surface of the supporting member coated with the particles with a predetermined space therebetween; and light irradiating means for irradiating at least the photoconductive member of the particle removing means with a light beam carrying image information to create conductive portions of the photoconductive member corresponding to blank portions of the image information.

11. The selective particle applying device according to claim 10, wherein said photoconductive member and the back plate have a transparent characteristic.

12. The selective particle applying device according to claim 11, wherein said back plate is connected to a DC power supply having an opposite polarity of the charged particles.

13. The selective particle applying device according to claim 10, wherein said particle removing means further comprises a counter electrode that is disposed opposite to said particle removing electrode with a predetermined space therebetween.

14. The selective particle applying device according to claim 13, wherein said counter electrode has a transparent characteristic and is connected to a DC power supply having an opposite polarity of the charged particles.

15. The selective particle applying device according to claim 14, wherein said light irradiating means comprises an image forming lens, a semitransparent mirror, three mirrors, and a Dove prism, and a light beam carrying image information is split into two split light beams by said semitransparent mirror, one of the split light beams being projected directly on said counter electrode and the other split light beam being inverted by said three mirrors and said Dove prism, said inverted split light beam being projected from behind said back plate on said particle removing electrode.

16. A selective particle applying device according to claim 10, further comprising:

a conveying mechanism for conveying the particles removed by said particle removing means to said particle applying means.

17. The selective particle applying device according to claim 16, wherein said particle applying means comprises:

a particle feed roller for triboelectrically charging the particles and for adhering and feeding the charged particles to the surface thereof;

a doctor blade for maintaining the thickness of the layer of particles adhering to the surface of said particle feed roller constant and for smoothing the surface of the layer of particles;

a particle carrying roller for carrying the charged particles transferred from said particle feed roller; and a particle applying electrode disposed opposite to said particle carrying roller with a predetermined space therebetween for applying the charged particles on the particle carrying roller onto the entire surface of the supporting member.

18. The selective particle applying device according to claim 17, wherein said particle removing electrode is a photoconductive roller having a photoconductive outer layer as the photoconductive member; and said particle removing means further comprises:
 a charger for charging said photoconductive layer to a predetermined polarity;
 a particle removing blade for scraping the particles adhering to the surface of said photoconductive roller; and
 a transparent electrode being disposed opposite to said photoconductive roller with a predetermined space therebetween.

19. The selective particle applying device according to claim 18, wherein said conveying mechanism comprises:
 an endless conveyor belt for conveying the particles removed from said supporting member by said particle removing means, said endless conveyor belt being in contact with said particle feed roller and;
 a pair of drive rollers for driving said endless conveyor belt.

20. The selective particle applying device according to claim 19, wherein said particle applying means, said particle removing means and said conveying mechanism are contained in a casing, said conveying mechanism being disposed below said particle applying means and said particle removing means.

21. The selective particle applying device according to claim 10, wherein said particle removing electrode is a photoconductive drum having a photoconductive outer layer as the photoconductive member; and said particle removing means further comprises:
 a charger for charging said photoconductive layer to a predetermined polarity; and
 a cleaning unit for removing the particles adhering to the surface of said photoconductive drum.

* * * * *